United States Patent [19]

Kessler et al.

[11] Patent Number: 5,110,712
[45] Date of Patent: May 5, 1992

[54] INCORPORATION OF DIELECTRIC LAYERS IN A SEMICONDUCTOR

[75] Inventors: Daniel D. Kessler; Robert W. Wu; Christopher C. Beatty; Mark D. Crook, all of Fort Collins, Colo.

[73] Assignee: Hewlett-Packard Company, Palo Alto, Calif.

[21] Appl. No.: 547,093

[22] Filed: Apr. 25, 1990

Related U.S. Application Data

[63] Continuation of Ser. No. 341,293, Apr. 19, 1989, abandoned, which is a continuation of Ser. No. 61,850, Jun. 12, 1987, abandoned.

[51] Int. Cl.$^5$ .................................................. G03C 5/00
[52] U.S. Cl. .................................... 430/312; 430/313; 430/314; 430/316; 430/317; 427/96; 427/99; 156/643; 437/228
[58] Field of Search ............... 430/312, 313, 314, 316, 430/317; 427/96, 99; 156/643

[56] References Cited

U.S. PATENT DOCUMENTS

| 4,367,119 | 1/1983 | Logan et al. | 430/313 |
| 4,447,824 | 8/1984 | Collingwood et al. | 357/71 |
| 4,495,220 | 1/1985 | Wolf et al. | 427/82 |
| 4,539,222 | 9/1985 | Anderson et al. | 427/88 |
| 4,745,045 | 5/1988 | Fredericks et al. | 430/315 |

FOREIGN PATENT DOCUMENTS

| EP-A-0-046 525 | 3/1982 | European Pat. Off. | |
| 158884 | 12/1979 | Japan | 430/314 |

OTHER PUBLICATIONS

Todokoro, "Novel Triple Layer Resist System", Electronics Letters, vol. 18 (13), Jun. 1982, pp. 543-5.
Hamma et al., "Polyimide Lift-Off Technology . . . ", IEEE Trans. Electron Devices, vol. ED28 (5), May 1981, pp. 552-6.
Yutaka Misawa et al., "A New Multilevel Interconnection System for Submicrometer VLSI's Using Multilayered Dielectrics of Plasma Silicon Oxide and Low-Thermal-Expansion Polyimide", IEEE Transactions on Electron Devices, vol. ED-34, No. 3, Mar. 1987, pp. 621-627, Fig. 1; p. 622, left-hand column, chapter III.B, Fabrication Process.
IBM Technical Disclosure Bulletin, "Via Hole Etch Process Through a Polyimide/Nitride Composite Layer", vol. 27, No. 11, Apr. 1985, pp. 6783-6784, New York, U.S., whole article.

Primary Examiner—Charles L. Bowers, Jr.
Assistant Examiner—Thomas R. Neville
Attorney, Agent, or Firm—William W. Cochran, II

[57] ABSTRACT

A system for integrating a composite dielectric layer in an integrated circuit to facilitate fabrication of a high density multi-level interconnect with external contacts. The composite dielectric layer comprises of a polymer layer which normally comprises a polyimide that is deposited using conventional spin-deposit techniques to form a planarized surface for deposition of an inorganic layer typically comprising silicon dioxide or silicon nitride. The inorganic layer is etched using standard photoresist techniques to form an inorganic mask for etching the polymer layer. A previously deposited inorganic layer functions as an etch stop to allow long over etches to achieve full external contacts which, in turn, allows high density interconnect systems on multiple levels.

9 Claims, 3 Drawing Sheets

INCORPORATION OF DIELECTRIC LAYERS IN A SEMICONDUCTOR

CROSS REFERENCE TO RELATED APPLICATION

This is a continuation of copending application Ser. No. 07/341,293 filed on Apr. 19, 1989, now abandoned. Which is a continuation of application Ser. No. 07/061,850, filed June 12, 1987, now abandoned.

BACKGROUND OF THE INVENTION

A. Field of Invention

The present invention pertains generally to fabrication of semiconductors and more particularly fabrication of integrated circuit devices using a composite dielectric layer.

B. Description of the Background

Spin-on polymers such as polyimides are widely recognized as excellent dielectric materials for use in fabricating multi-level interconnects. Although these polymers perform an excellent job of planarizing underlying topography, the polymer layers are generally found to have low-yield strength relative to inorganic dielectrics and poor dry etch selectivity to commonly used photolithographic masking materials. As a result, highly stressed conductor materials, which have a number of advantageous features, cannot be used in combination with spin-on polymers.

Additionally, when spin-on polymers are placed over a varying topography, feature dependent thickness variations result. In other words, although the upper surface of the polymer layer is planarized, the depth of the polymer layer varies in accordance with the height of the underlying structures. These variations greatly complicate the etching of vias, i.e., vertical openings that allow the connection of conductors between multiple layers. Vias over thin polymer regions must be capable of sustaining long etches without creating unwanted connections to underlying areas while the vias in the thicker polymer regions are being etched. Generally, this problem is avoided by requiring the via features to be internal to the underlying metal features to which the contact is being made. In other words, the vias, or openings, must be fully enclosed by underlying metal features so that during the process of etching the polymer layer, over-etching can be achieved without damaging the underlying structure since the polymer etcher will not etch the metal feature. This requires that dogbones, i.e., enlarged metal features, be employed to ensure full vertical registration of the vias with the metal features. However, dogbones severally limit the density of circuitry that can be achieved in the integrated circuit device.

Fabrication of highly dense, multi-level interconnections necessitates the ability to planarize underlying topography so that submicron etching can be achieved with high fidelity. In other words, the flat surface of the semiconductor layer facilitates detailed masking at a submicron level. Additionally, the fabrication of highly dense, multi-level interconnection requires the capability of vias to be external relative to the underlying metal features to which contact is to be made. In other words, the vias, or openings, can extend over the edges underlying feature. These characteristics have not been achieved by prior art devices.

SUMMARY OF THE INVENTION

The present invention overcomes the disadvantages of the prior art by providing a multi-level dielectric layer comprising a polymer and an inorganic material. The polymer material provides a substantially planar surface on which an inorganic layer is deposited. The inorganic layer acts as a non-erodible etch mask during polymer patterning and eliminates etch selectivity concerns between the polymer and the photolithographic mask, allowing small features to be easily transferred into the polymer using standard dry etch techniques. Additionally, when the composite comprising the polymer and inorganic layer is employed in a multi-level interconnect process, the inorganic layer from the previous level provides an etch stop for the polymer via etch. This allows vias to be external to the underlying metal features without concerns of accidentally creating unwanted interconnections to conductors below these features. Moreover, through proper selection of the inorganic material, the composite strength of the polymer/inorganic composite layer is greatly increased. This allows the use of spin-on polymers in combination with highly stressed conductor materials such as tungsten.

DETAILED DESCRIPTION OF THE INVENTION

Figure 1:
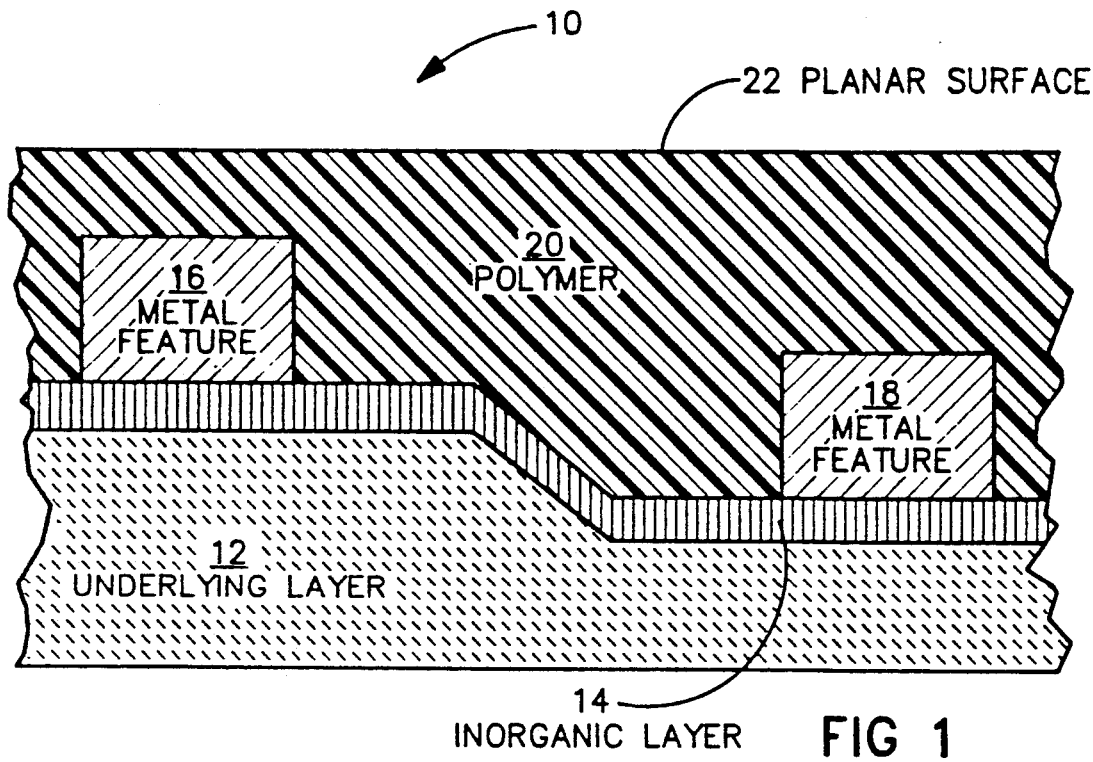
FIG. 1 is a schematic illustration of an initial stage of fabrication of the device of the present invention illustrating the deposition of a polymer layer on an existing integrated circuit.

FIG. 1 schematically illustrates a semiconductor device 10 having an underlying layer 12 that has a predetermined topology, as schematically illustrated by the sloped structure. Inorganic layer 14 can comprise an inorganic material deposited in an initial stage of the process of the present invention, or can comprise a second inorganic masking layer of a lower structure in a multi level process that was previously deposited in accordance with the present invention. Metal features 16 and 18 are deposited and etched on inorganic layer 14, and a polymer layer 20, is deposited on the structure to provide a substantially planar surface 22. The polymer 20, which can comprise any one of a number of standard polyimides, is suspended in a solvent and deposited on the surface of the semiconductor. A typical example of integrated circuit grade polyimide brands include Dupont DP2545, DP2555 and DP2566 available from Dupont Corporation, and Hitachi PIQ-13, PIX-1400, PIX-L100, PIX-L110, PIX-L120 available from Hitachi Corporation. Chemical names for these polyimides comprise the following:

p-PDA/S-BPDA, DATP/PMDA, PMDA/ODA, DDE/BTDA.

PMDA and BTDA are more fully disclosed in "Thermal Expansion Behavior of Various Aeromatic Polyimides," Polymer Journal, Vol. 7, No. 8, pp. 981-983, 1985.

The semiconductor is then spun to uniformly distribute the polymer material across the surface of the semiconductor device 10 in a uniform manner to produce planar surface 22. The solvent is then removed using standard thermal curing techniques. For example, the wafer can be placed on a hot plate in clean room airflow at 85° C. for 60 seconds and then placed in an oven at a 100°0 C. in nitrogen flowing at 6 liters per minute for 30 minutes. The wafer is then baked at 200° C. in nitrogen flowing at 6 liters per minute for 30 minutes and then at 450° C. in nitrogen flowing at 12 liters per minutes for 30 minutes. After the polymer deposition process is completed, the substrate is then baked at low temperature to drive out any moisture absorbed by the polymer. For example, the wafer can be placed in a 200° C. nitrogen flowing oven for 30 minutes. A typical thickness of the polymer achieved by the above process is 4000 angstroms. The surface of the polymer is then roughen to improve the adhesion of subsequently deposited layers. This is accomplished by exposing the substrate to a plasma environment.

Figure 2:
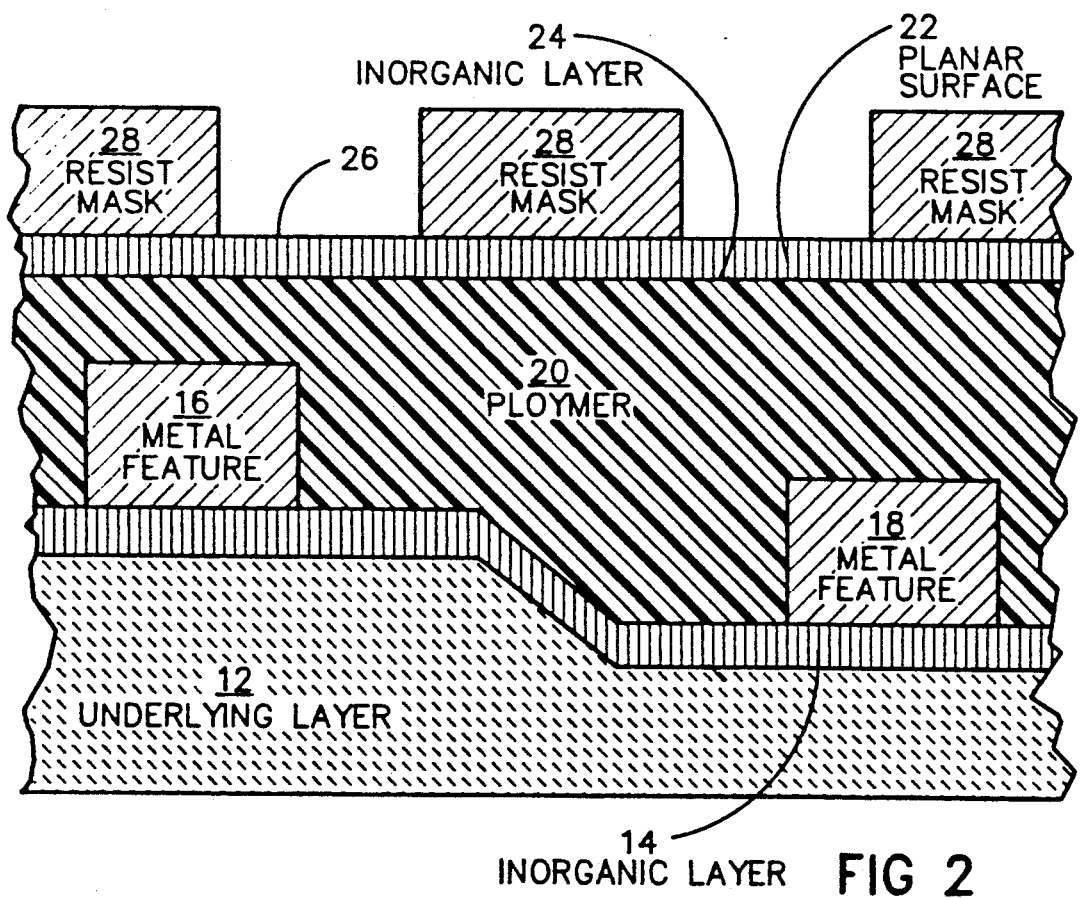
FIG. 2 illustrates a subsequent stage illustrating the inorganic layer prior to etching.

The second inorganic layer 24 is then deposited on planar surface 22 of polymer 20, as illustrated in FIG. 2. FIG. 2 illustrates the structure of FIG. 1, including metal features 16 and 18, first inorganic layer 14 and underlying layer 12. The manner of deposition, thickness and composition of inorganic layer 24 are chosen to be compatible with the underlying polymer layer 20 to provide the required strength for the composite dielectric sandwich including inorganic layer 24 and polymer 20 when used with a particular metal feature to be deposited on the upper surface of 26 of inorganic 24. Typical examples of materials which can be used as inorganic layer 24 include doped and undoped silicon dioxide and silicon nitride. Common methods of applying silicon dioxide layers include plasma enhanced vapor deposition and atmospheric pressure deposition techniques. Silicon nitride layers can be applied using plasma enhanced chemical deposition vapor techniques. For example, the following conditions can be utilized.

Pressure = 1.4 torr
Power = 120 watts
Temperature = 400° C.
$NH_3:SiH_4$ ratio = 8
Total flow = 2361 SCCM Atmospheric Pressure Chemical Vapor Deposition (APCVD) oxide conditions comprise the following:

Pressure = 1 atmosphere
$O_2$:Hydride Ratio = 27:1
$O_2$ = 4.48 SCCM
$H_2$ = 6.56 SCCM
$SiH_4$ = 0.045 SCCM
$PH_3$ = 0.067 SCCM
Temperature = 415° C.

Patterning of vias in the dielectric composite is accomplished using standard photolithographic techniques and common resist masking materials. As illustrated in FIG. 2, resist mask 28 is formed using these standard methods. Inorganic layer 24 is resistant to the etching material for the resist mask 28.

Figure 3:
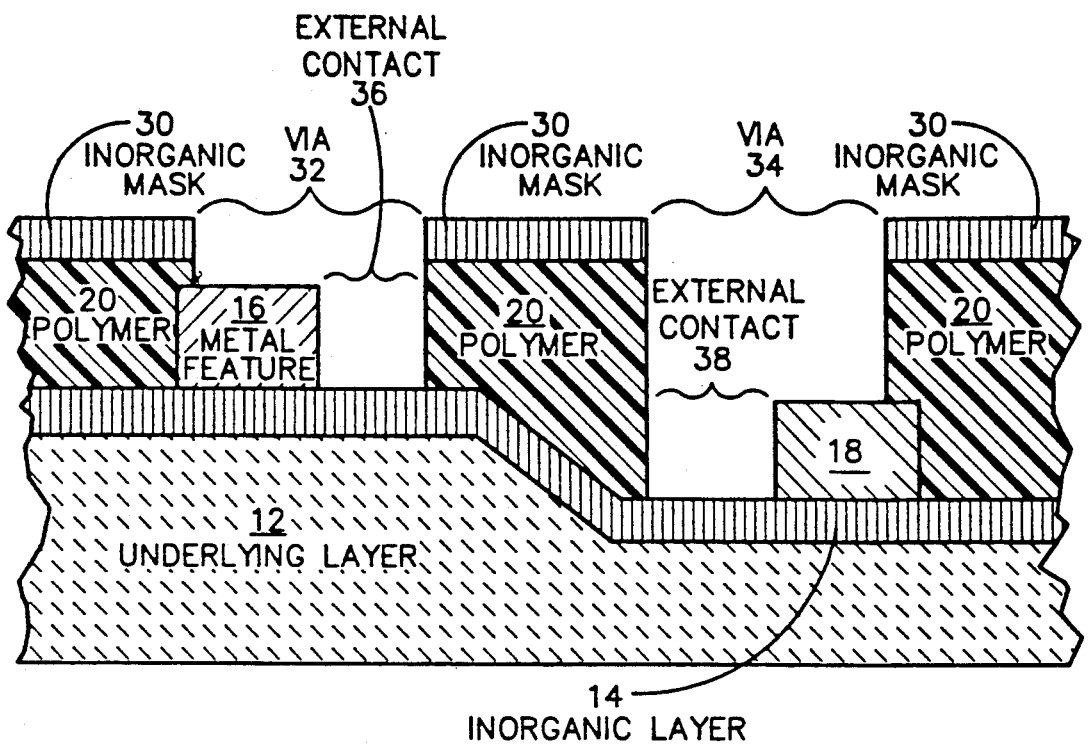
FIG. 3 illustrates the device of FIG. 2 after etching of the inorganic and polymer layers.

FIG. 3 illustrates the manner in which the inorganic layer 24 and polymer layer 20 are etched in accordance with the present invention. The etching process is carried out with a reactive ion etcher to minimize lateral linewidth loss. The anisotropic nature of the reactive ion etcher additionally minimizes undercutting of the polymer layer 20. The etching process is preformed in two phases. In the first phase, the inorganic layer 24 (FIG. 2) is etched using the resist mask 28 (FIG. 2) as a pattern mask. A typical example of an etch gas used to etch the inorganic layer 24 (FIG. 2) comprises $CF_4$. The etching process is stopped after the polymer is exposed in the openings between the resist mask 28. As shown in FIG. 3, an inorganic mask 30 is then formed which can be used to etch the polymer layer 20, comprising the second phase of the etching process. Gases to be used on the reactive ion etcher during the second phase of the etching process are chosen to maximize feature linewidth control since selectivity to the organic mask 30 is not a concern. Typical etching gasses employed include $O_2$ in combination with noble gasses such as argon. Oxygen:Argon mixtures can range from 0 to 50% argon to produce etch rates of the polyimide of 200 to 400 angstroms per minute.

The process of etching the polymer layer 20 results in the formation of vias, such as vias 32 and 34 illustrated in FIG. 3. Since there is not full vertical registration between the inorganic mask 30 and underlying metal features 16 and 18, external contacts result such as external contacts 36 and 38, respectively. Long overetches are possible even with the existence of external contacts 36 and 38 since the polymer layer 20 is always placed over inorganic layer 14 which can be initially deposited in the process of the present invention, or can comprise an inorganic mask layer, such as inorganic mask layer 30 of a lower dielectric layer of multi level structure previously deposited in accordance with the present invention. Design criteria never allow a metal feature, such as metal feature 16 or 18, to be placed over lower vias, so that the inorganic mask is always below external contacts 36 and 38 to prevent etching into the underlying layer 12. This differs from the prior art in that the layer below the metal features 16 and 18 typically comprise another polymer layer 20 which would be etched during long over-etches of polymer layer 20. Hence, inorganic layer 14 functions as an etch stop for the polymer etch process so as to prevent unwanted interconnections to underlying conductors.

Following the via etches, any remaining photoresist is removed from the device using common resist strip solutions which are compatible with the polymers such as J100 and J100NP available from Industri-Chem located in Richardson, Texas. The device is then baked at a low temperature to drive out any moisture absorbed by the polymer in the via holes in accordance with the process described above.

Figure 4:
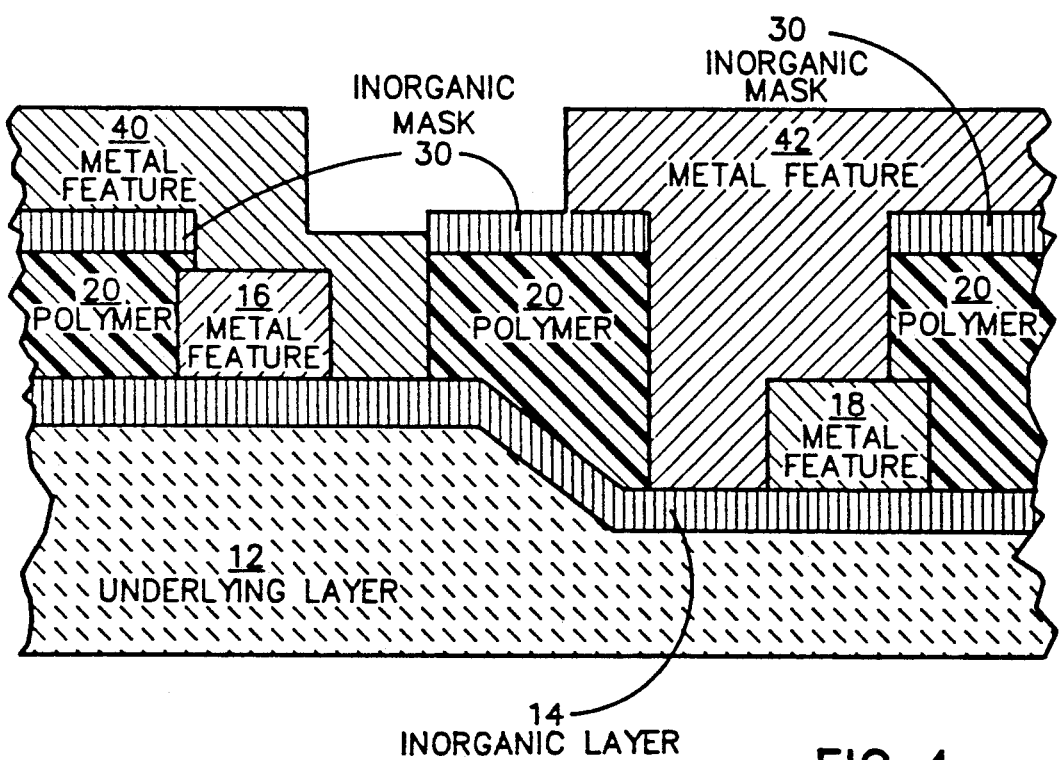
FIG. 4 illustrates the device of FIG. 3 after deposition of metal features.

FIG. 4 illustrates the manner in which metal features 40 and 42 are deposited in the device to provide full external contact with metal features 16 and 18, respectively. Metal features 40 and 42 can be deposited using standard sputtering or chemical vapor deposition techniques. If step coverage in the vias is a concern, techniques which fill the vias with metal can be employed, including bias sputtering, CVD metal deposition and the formation of metal plugs using various tungsten metal processing techniques. When plug techniques are employed, subsequent blanket metal deposition is usually necessary such as low-pressure chemical vapor deposition of tungsten and aluminum. The resulting film is used for patterning the conductor lines. After metal deposition, the metal is patterned using standard photolithographic techniques and a suitable mask. A etch compatible with a conductor metal and mask is then used to pattern the conductor features. This process is followed by a resist strip process to remove any remaining masking material. This process can be repeated to provide multiple vertically disposed layers and so as to produce the desired number of interconnect levels.

Figure 5:
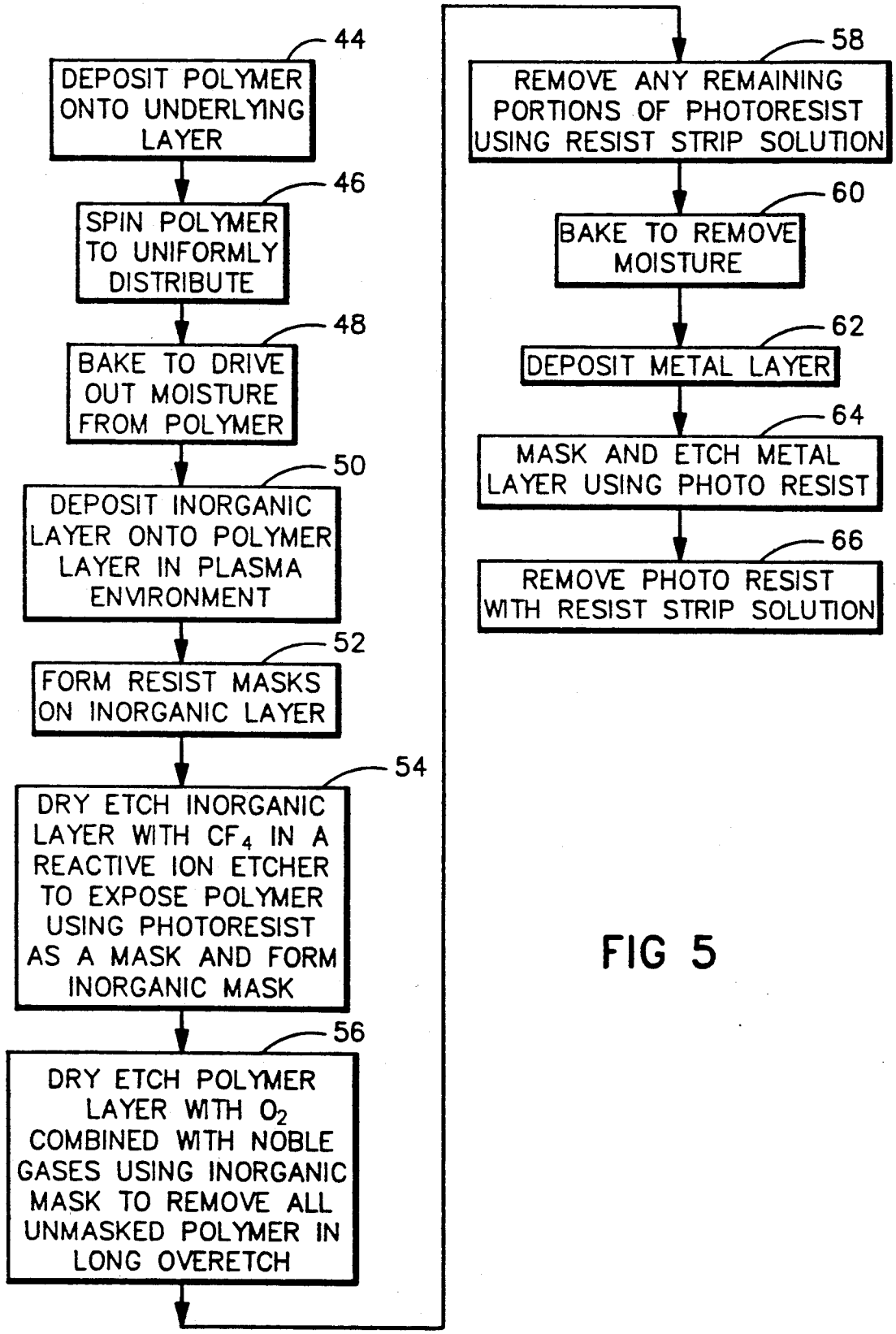
FIG. 5 is a schematic flow diagram of the process of the present invention.

FIG. 5 is a schematic flow diagram of the process of the present invention. As disclosed in FIG. 5 at step 44, the polymer is deposited onto the underlying layer and spun to uniformly distribute the polymer across the surface of the wafer, as disclosed as step 46. The wafer is then baked to drive out moisture from the polymer as disclosed as step 48. The second inorganic layer 24 (FIG. 2) is then deposited onto the polymer layer 20 (FIG. 2) in a plasma environment to roughen the surface of the polymer layer, as disclosed as step 50. Resist masks 28 are then formed on the upper surface 26 (FIG. 2) of inorganic layer 24 (FIG. 2), as disclosed in step 52. Inorganic layer 24 (FIG. 2) is then dry etched with a CF4 plasma and a reactive ion etcher to expose polymer layer 20 (FIG. 2) using the photoresist 28 as a mask to form an inorganic mask 30 (FIG. 3), as disclosed as step 56. As disclosed as step 58, the remaining portions of the photoresist are removed using a resist stripping solution. The remaining structure is then baked to remove the moisture as disclosed at step 60. A metal layer is then deposited and etched using a photoresist, as disclosed as steps 62 and 64. The photoresist is then removed with a resist strip solution as disclosed at step 66.

The present invention therefore provides a unique method of utilizing an inorganic layer over a spin-on polymer to act as a non-erodible mass during etching of the polymer. The application of this inorganic layer to also provide an etch stop during the polymer etch in vias in a multiple layer structure allows for long overetches to be achieved so that dense interconnect systems can be fabricated employing external contacts. Since the inorganic layer is not susceptible to the polymer etching, high process margin is available for the via etch step.

Additionally, the use of an inorganic layer to improve the strength of the polymer dielectric comprises a unique aspect of the present invention. Through proper selection of the inorganic layer, the capability to utilize higher stress conductor materials such as tungsten is achieved. The use of tungsten is desireable because tungsten is not susceptible to electrical migration problems. Low pressure chemical vapor deposition techniques of depositing tungsten allow full vertical innerconnections for external contacts since this process of depositing the tungsten provides uniform coverage in the vias and external contacts. Spin-on polymers are simple and inexpensive to implement providing an excellent low-cost means of creating the desired planar surfaces required at each inter-connect level. The addition of an inorganic layer on the surface of the polymer layer provides a path for integrating these materials to create very high density interconnect systems.

The foregoing description of the invention has been presented for purposes of illustration and description. It is not intended to be exhaustive or to limit the invention to precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A process for forming a composite dielectric sandwich in an integrated circuit through the use of inorganic dielectric layers comprising the steps of:
   (a) forming a first inorganic dielectric layer over at least one underlying layer of said integrated circuit that has sufficient strength to protect said underlying layer by distributing stress from subsequently formed metal features that are deposited on said first inorganic dielectric layer;
   (b) forming first metal features on said first inorganic dielectric layer;
   (c) forming a polymer layer over said first inorganic dielectric layer and said first metal features of said integrated circuit, said polymer layer being substantially uniformly distributed to provide a substantially planarized surface;
   (d) depositing a second inorganic dielectric layer in said integrated circuit over said polymer layer that provides sufficient strength to protect said polymer layer by distributing stress from subsequently formed second metal features that are deposited on said second inorganic dielectric layer;
   (e) forming a mask on said second inorganic dielectric layer;
   (f) etching said second inorganic dielectric layer using said mask as a masking pattern to form an inorganic dielectric mask and to provide a protective layer for etching of any subsequently deposited polymer layers;
   (g) etching said polymer layer using said inorganic dielectric mask as a masking pattern to essentially remove all polymer unmasked by said inorganic dielectric mask between said inorganic dielectric mask and said first inorganic dielectric layer such that said first inorganic dielectric layer functions as a protective layer and etch stop for said underlying layers wherever said etching of said polymer layer continues after all of said unmasked polymer has been removed to fully expose any existing external contact surfaces of said first metal features;
   (h) maintaining said second inorganic dielectric layer as an insulating layer that, together with said polymer layer, forms said composite dielectric sandwich that has sufficient strength to distribute stress from subsequently formed second metal features and that remains in said integrated circuit as an etch stop layer for subsequently formed layers in a multilayer integrated circuit;
   (i) forming said second metal features on said second inorganic dielectric layer an in vias formed by etching said polymer layer.

2. The process of claim 1 wherein said step of forming said polymer layer comprises the steps of:
   depositing a polymer suspended in a solvent on said first inorganic dielectric layer;
   uniformly distributing said polymer suspended in said solvent by spinning said integrated circuit;
   thermally curing said polymer to remove said solvent.

3. The process of claim 1 wherein said step of depositing said second inorganic dielectric layer comprises the step of applying silicon dioxide using plasma enhanced chemical vapor deposition.

4. The process of claim 1 wherein said step of depositing said second inorganic dielectric layer comprises the step of applying silicon dioxide using atmospheric pressure deposition.

5. The process of claim 1 wherein said step of forming a mask on said second inorganic dielectric layer comprises:
- depositing a photoresist layer on said second inorganic dielectric layer that is highly planarized so that small features can be transferred to said polymer layer;
- exposing said photoresist layer using photolithographic techniques with a predetermined masking pattern;
- etching said photoresist layer to produce a photoresist mask essentially corresponding to said predetermined masking pattern.

6. The process of claim 1 wherein said step of etching said second inorganic dielectric layer comprises the step of dry etching said second inorganic dielectric layer with carbon tetraflouride in a reactive ion etcher.

7. The process of claim 1 wherein said step of etching said polymer layer comprises dry etching said polymer layer with oxygen noble gas ions in a reactive ion etcher.

8. The process of claim 1 wherein said underlying layers of said integrated circuit comprise at least one composite dielectric layer formed in accordance with steps (a) through (h) of claim 1 and said first inorganic layer is formed such that the manner of deposition, the thickness and the composition of said first inorganic layer are chosen to be compatible with an underlying polymer layer that is deposited over said at least one underlying layer of said integrated circuit such that said first inorganic layer provides the required strength to distribute stress from said first metal features that are deposited on said first inorganic layer that are formed from a highly stressed metal layer.

9. The process of claim 1 wherein said step of depositing said second inorganic dielectric layer comprises using plasma enhanced chemical vapor deposition such that sad second inorganic dielectric layer is placed in compressive stress to compensate for tensile stress of subsequently deposited metal layers.

* * * * *